(12) United States Patent
Konrath et al.

(10) Patent No.: US 9,508,711 B2
(45) Date of Patent: Nov. 29, 2016

(54) SEMICONDUCTOR DEVICE WITH BIPOLAR JUNCTION TRANSISTOR CELLS

(71) Applicant: Infineon Technologies AG, Neubiberg (DE)

(72) Inventors: Jens Peter Konrath, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 43 days.

(21) Appl. No.: 14/096,338

(22) Filed: Dec. 4, 2013

(65) Prior Publication Data

US 2015/0155279 A1 Jun. 4, 2015

(51) Int. Cl.

| | |
|---|---|
| H01L 21/8222 | (2006.01) |
| H01L 27/082 | (2006.01) |
| H01L 29/08 | (2006.01) |
| H01L 29/10 | (2006.01) |
| H01L 27/06 | (2006.01) |
| H01L 29/66 | (2006.01) |
| H01L 29/732 | (2006.01) |
| H01L 29/74 | (2006.01) |
| H01L 29/16 | (2006.01) |

(52) U.S. Cl.
CPC ....... *H01L 27/0823* (2013.01); *H01L 27/0664* (2013.01); *H01L 29/0804* (2013.01); *H01L 29/1004* (2013.01); *H01L 29/66068* (2013.01); *H01L 29/732* (2013.01); *H01L 29/7428* (2013.01); *H01L 29/1608* (2013.01)

(58) Field of Classification Search
CPC ........................ H01L 29/0804; H01L 29/1004
See application file for complete search history.

(56) References Cited

U.S. PATENT DOCUMENTS

| | | | |
|---|---|---|---|
| 6,566,201 B1 | 5/2003 | Blanchard | |
| 8,367,532 B2 | 2/2013 | Mauder et al. | |
| 8,421,196 B2 | 4/2013 | Weber et al. | |
| 2003/0011039 A1 | 1/2003 | Ahlers et al. | |
| 2003/0160302 A1* | 8/2003 | Sankin ................ | H01L 29/732 257/565 |
| 2011/0121437 A1* | 5/2011 | Weber ................ | H01L 29/0634 257/655 |
| 2013/0146894 A1* | 6/2013 | Cheng ............... | H01L 29/66068 257/77 |

FOREIGN PATENT DOCUMENTS

WO 2007085387 A1 8/2007

* cited by examiner

*Primary Examiner* — Raj R Gupta
(74) *Attorney, Agent, or Firm* — Murphy, Bilak & Homiller, PLLC

(57) ABSTRACT

A semiconductor device includes a bipolar junction transistor cell including an emitter region which is at least partly formed between mesas of a semiconductor body. The emitter region extends between a first surface of the semiconductor body and an emitter bottom plane. The transistor cell further includes a collector region and a base region that separates the emitter region and the collector region.

14 Claims, 11 Drawing Sheets

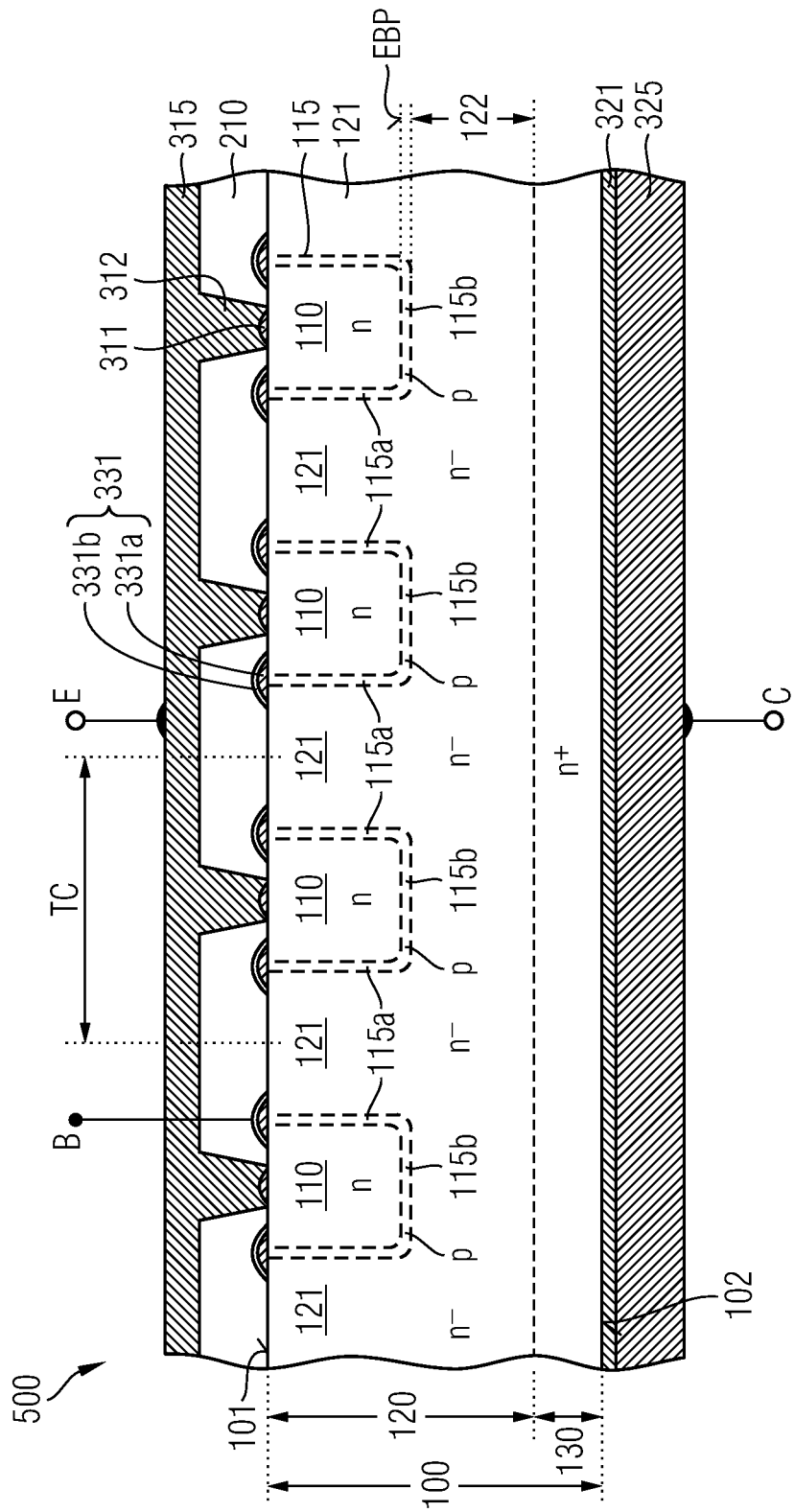

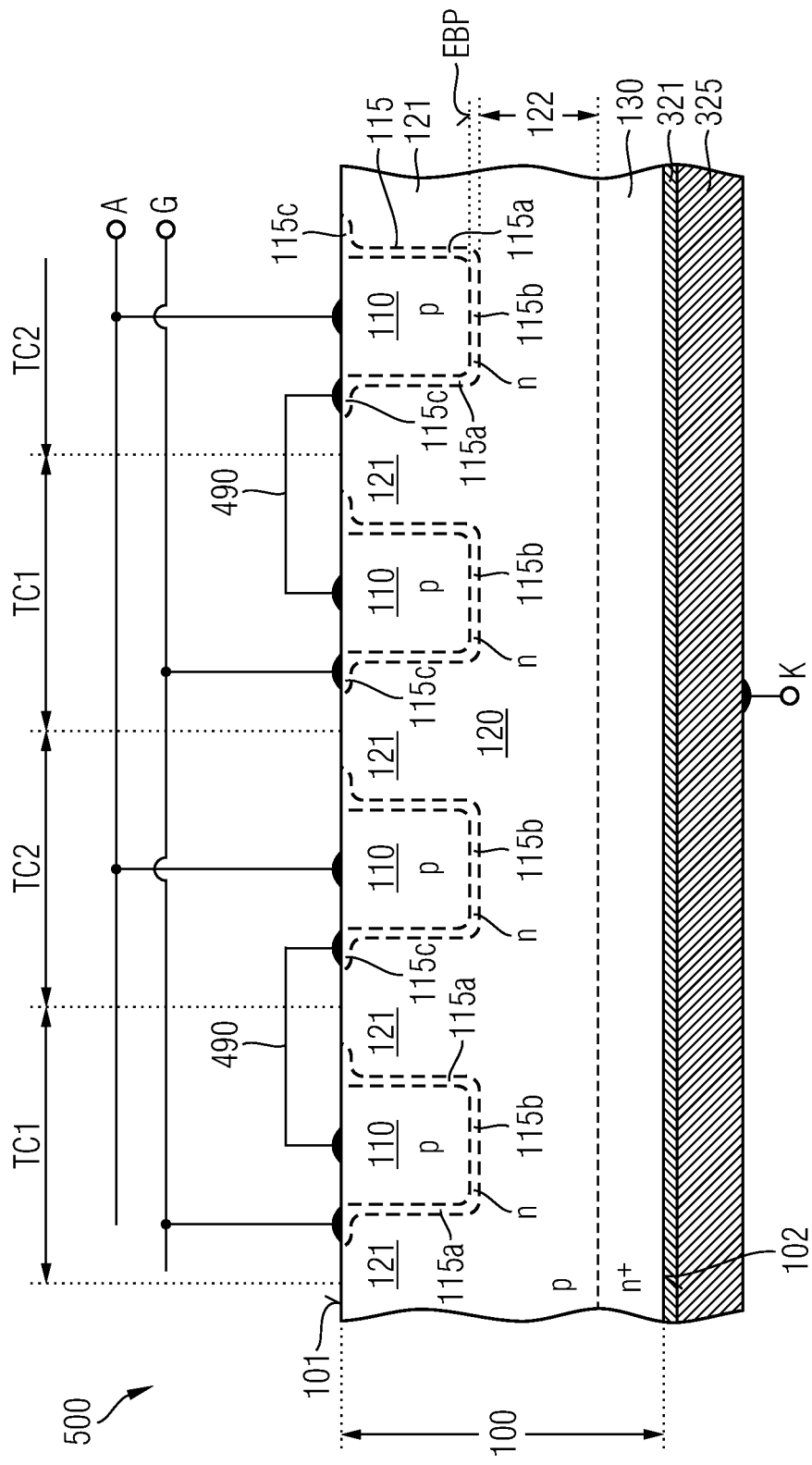

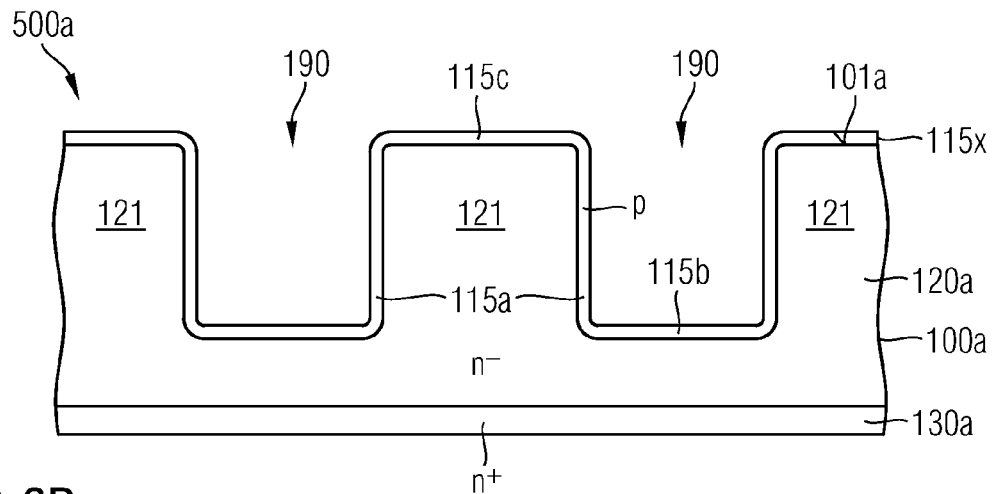
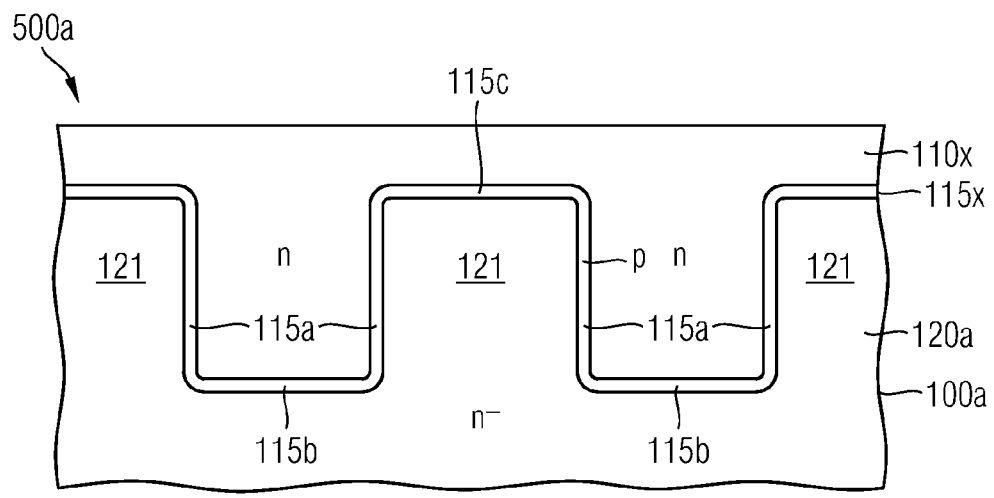
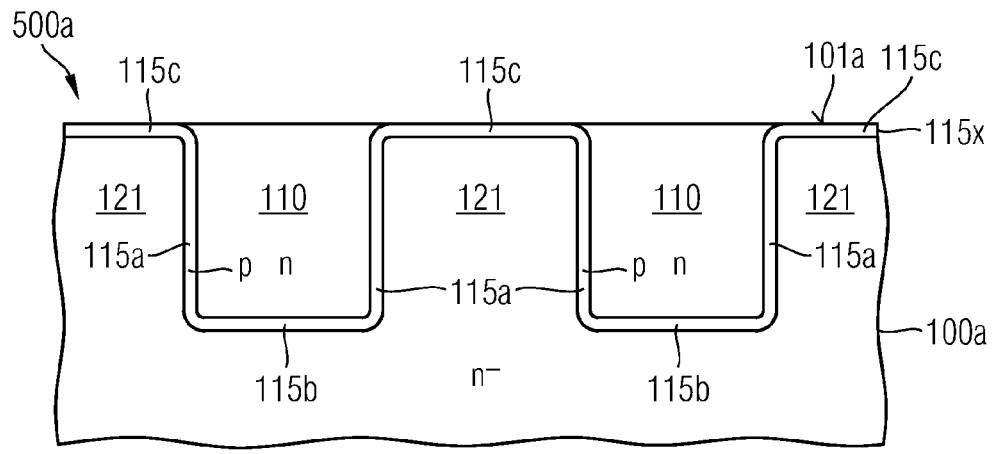

SEMICONDUCTOR DEVICE WITH BIPOLAR JUNCTION TRANSISTOR CELLS

BACKGROUND

BJTs (bipolar junction transistors) used in switching and amplifying applications include a first pn junction at the boundary between a collector and a base region and a second pn junction at the boundary between the base and an emitter region. The emitter and collector regions have a first conductivity type and the base region a second conductivity type opposite to the first conductivity type. While for most of the semiconductor materials used for BJTs dopant implantation is available for forming the pn junctions, some materials such as silicon carbide SiC show very low dopant diffusion rates and therefore use epitaxy for providing a vertical topology with the collector region, the base region and the emitter regions disposed in a stack on top of each other. Etch processes define the lateral dimensions of the emitter and base regions. The result is a vertical design with the emitter regions formed in mesas. There is a need for providing semiconductor devices including BJT cells with better definable device parameters.

SUMMARY

An embodiment refers to a semiconductor device that includes a bipolar junction transistor cell including an emitter region which is at least partly formed between mesas of a semiconductor body. The emitter region extends between a first surface of the semiconductor body and an emitter bottom plane. The transistor cell further includes a collector region and a base region that separates the emitter region and the collector region.

Another embodiment is related to a method of manufacturing a semiconductor device. A trench is formed in a collector region of a semiconductor body having a first conductivity type. A first semiconductor layer of a second conductivity type is grown by epitaxy on the semiconductor body, wherein first portions of the first semiconductor layer cover sidewalls of mesas directly adjoining the trench. A second semiconductor layer of the first conductivity type is grown by epitaxy on the first semiconductor layer and at least partly fills the trench.

According to another embodiment a method of manufacturing a semiconductor device includes forming trenches in a semiconductor body. A semiconductor layer of a first conductivity type is grown by epitaxy on the semiconductor body, wherein first portions of the semiconductor layer are formed in the trenches. A second portion of the semiconductor layer outside the trenches is removed to form, from the first portions, emitter and collector regions of bipolar junction transistor cells. Base regions of the second conductivity type are formed in mesas of the semiconductor body between the emitter and collector regions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic cross-sectional view of a portion of a semiconductor device including BJT cells in accordance with an embodiment providing base regions completely between mesas.

FIG. 5B is a schematic cross-sectional view of a portion of a semiconductor device in accordance with an embodiment related to an AGT (amplifying-gate thyristor).

FIG. 6A is a schematic cross-sectional view of a portion of a semiconductor substrate for illustrating a method of manufacturing a semiconductor device with BJT cells after providing a first semiconductor layer.

FIG. 6B is a schematic cross-sectional view of the semiconductor substrate portion of FIG. 6A after providing a second semiconductor layer.

FIG. 6C is a schematic cross-sectional view of the semiconductor substrate portion of FIG. 6B after recessing the second semiconductor layer.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1B:
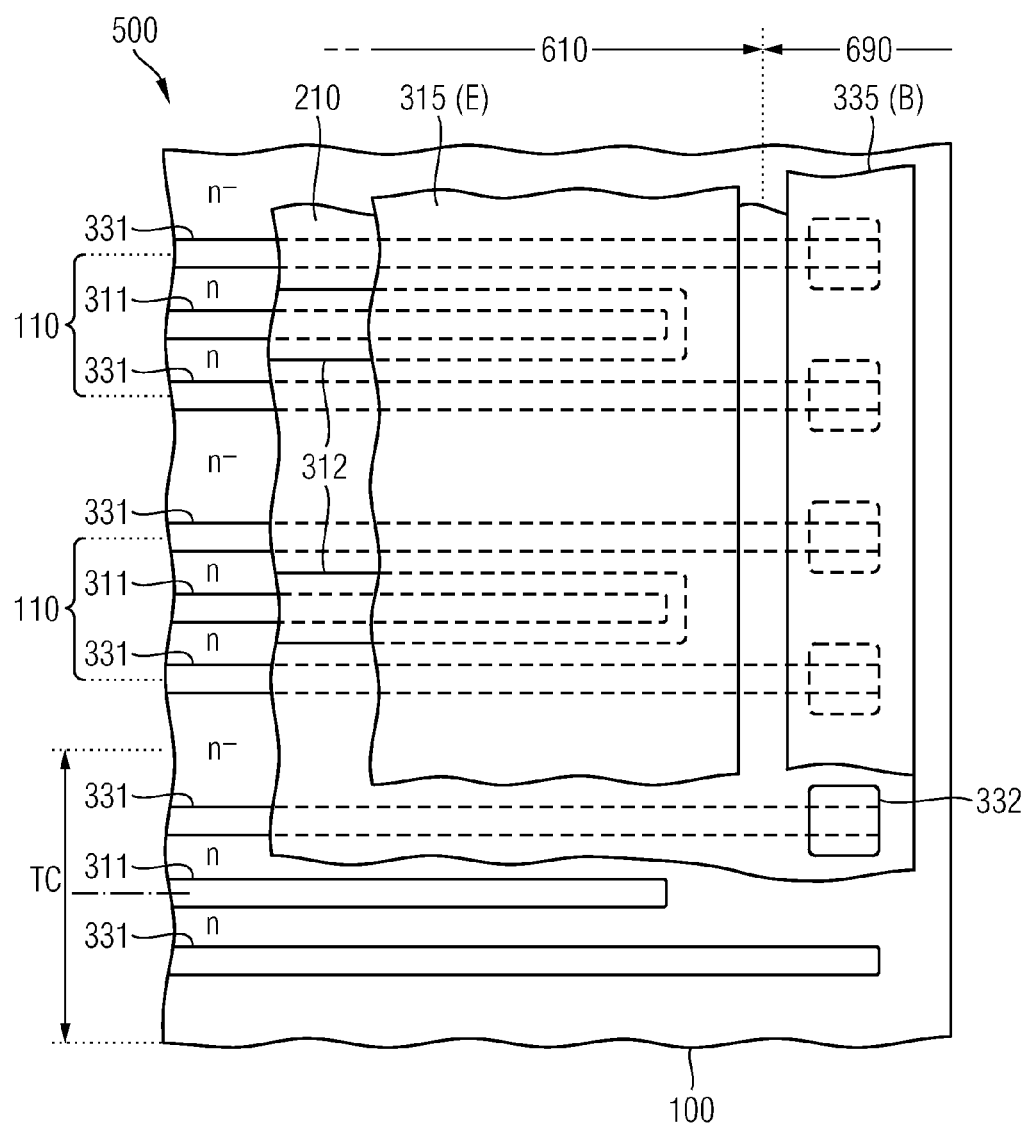
FIG. 1B is a schematic plan view of the portion of the semiconductor device of FIG. 1A.

FIGS. 1A to 1B refer to a semiconductor device 500 including a plurality of identical BJT (bipolar junction transistor) cells TC. The semiconductor device 500 may be a BJT with emitter, base and collector terminals E, B, C or a device including further semiconductor elements in addition to the BJT cells TC.

A semiconductor body 100 of the semiconductor device 500 is based on a single-crystalline semiconductor material such as silicon Si, germanium Ge, a silicon germanium crystal SiGe, or gallium arsenide GaAs. According to an embodiment the single-crystalline semiconductor material has a band gap of 2.0 eV or higher such as gallium nitride GaN or silicon carbide SiC. For example, the single-crystalline semiconductor material is silicon carbide SiC, for example 6H—SiC (SiC of the 6H polytype), 15R—SiC, 4H—SiC or 2H—SiC.

The semiconductor body 100 has a first surface 101, which may by approximately planar or which is defined by a plane spanned by coplanar surface sections, as well as a mainly planar second surface 102 parallel to the first surface 101. A normal to the first surface 101 defines a vertical direction and directions orthogonal to the vertical direction are lateral directions.

The semiconductor body 100 may include a lightly doped collector region 120 of a first conductivity type and may further include a heavily doped pedestal layer 130 between the collector region 120 and the second surface 102. An interface between the collector region 120 and the pedestal layer 130 is parallel to the second surface 102. The pedestal layer 130 may directly adjoin the second surface 102 and has a sufficiently high impurity concentration for an ohmic contact with a metallization. By way of example, the impurity concentration may be in a range from $1.0 \times 10^{18}$ cm$^{-3}$ to about $5.0 \times 10^{19}$ cm$^{-3}$. The impurity concentration in the collector region 120 is at most a tenth of that in the pedestal layer 130 and may be in a range from $1.0 \times 10^{13}$ cm$^{-3}$ to $1.0 \times 10^{18}$ cm$^{-3}$. A distance between the first and second surfaces 101, 102 may be at least 10 μm, for example at least 150 μm.

Emitter regions 110 are at least partly arranged between mesas 121 formed by protruding portions of the semiconductor body 100. The emitter regions 110 may be formed using an epitaxy process and may extend between the first surface 101 and an emitter bottom plane EBP. The emitter regions 110 have the first conductivity type and the impurity concentration is in substance uniform in each emitter region 110. The impurity concentration in the emitter regions 110 may be in a range from $5 \times 10^{18}$ cm$^{-3}$ to $5 \times 10^{20}$ cm$^{-3}$. In each emitter region 110 a vertical impurity concentration profile may be constant.

The emitter regions 110 may have vertical sidewalls or may taper, at least in sections, with increasing distance to the first surface 101. The sidewalls of the emitter regions 110 may be approximately planar, concave, convex or may be undulated. A bottom portion of the emitter regions 110 may be approximately planar or may be bowed.

The mesas 121 may form spatially separated protruding portions of the collector region 120. Sidewalls of the mesas 121 may be approximately planar and may be oriented perpendicular to the first surface 101. Further embodiments may provide convex or concave mesa sidewalls. A width of the mesas 121 may be between 1 μm and 10 μm. A center-to-center distance (pitch) of the mesas 121 may be between 2 μm and 20 μm. In the mesas 121 a vertical impurity concentration profile may be constant.

In addition to the mesas 121, which are oriented to the first surface 101, the collector region 120 may include a layer section 122 oriented to the second surface 102. The layer section structurally and electrically connects the mesas 121. According to another embodiment emitter and collector regions 110, 120 are formed on opposing sides of the mesas 121, respectively.

Base regions 115 of a second conductivity type, which is the opposite of the first conductivity type, separate the emitter regions 110 from the collector region 120. The base regions 115 may include first base portions 115a in the mesas 121 or along sidewalls of the mesas 121 as well as second base portions 115b between the mesas 121, wherein the second base portions 115b structurally connect the first base portions 115a in the vertical projection of the emitter regions 110. Each base region 115 may be a conformal layer of approximately uniform thickness lining a trench, wherein the trench is at least partly filled with the respective emitter region 110. In the base regions 115 lateral and vertical impurity concentration profiles may be constant.

According to the illustrated embodiment, the first conductivity type is the n-type and the second conductivity type is the p-type. The BJT cells TC are of the npn type. According to other embodiments the first conductivity type is the p-type, the second conductivity type is the n-type, and the BJT cells TC are of the pnp type.

Base contacts 331 may directly adjoin the first base portions 115a. The base contacts 331 may include a contact material 331a which is an ohmic metal suitable for forming an ohmic contact with the respective semiconductor material and the respective conductivity type. For npn SiC BJTs the contact material 331a may be or may contain aluminum Al or aluminum-titanium combinations/compounds/alloys AlTi, or cobalt silicide CoSi$_2$, by way of example. The base contacts 331 may further include a highly conductive structure 331b disposed on the contact material 331a to improve the transverse conductivity. The material of the highly conductive structure 331b may be gold Au, by way of example.

Emitter contacts 311 directly adjoin the emitter regions 110 at the side of the first surface 101. In case the semiconductor body 100 is based on SiC, the emitter contacts 311 may consist of or contain Nickel Ni, NiTi, NiAl, NiSi, NiCr or ternary combinations/compounds/alloys like NiAlTi, by way of example.

A dielectric passivation structure 210 may be provided on the first surface 101. The dielectric passivation structure 210 may be a homogenous layer or may include two or more sub-layers of different dielectric materials such as thermal semiconductor oxide, e.g., thermal silicon oxide, deposited semiconductor oxide, e.g., deposited silicon oxide, semiconductor nitride, e.g. silicon nitride, or semiconductor oxynitride, e.g. silicon oxynitride.

An emitter electrode 315 is provided at the side of the first surface 101 and contact structures 312 extending through openings in the dielectric passivation structure 210 electrically connect the emitter electrode 315 with the emitter contacts 311. The emitter electrode 315 may form or may be electrically connected or coupled to the emitter terminal E. According to another embodiment the emitter electrode 315 is electrically connected to other semiconductor elements integrated in the same semiconductor body 100 of the semiconductor device 500.

A collector contact 321 directly adjoins the second surface 102 and the pedestal layer 130. The collector contact 321 may be provided from a suitable ohmic metal, for example Ni or NiTi in case the semiconductor device 500 is based on SiC. A collector electrode 325 directly adjoins the collector contact 321 and may form or may be electrically connected or coupled to a collector terminal C.

FIGS. 1A and 1B refer to an embodiment with the base contacts 331 electrically connected to a base electrode 335. The base electrode 335 may form or may be electrically connected or electrically coupled to a base terminal B of the semiconductor device 500. According to other embodiments, the base contacts 331 may be electrically connected to an electronic element or an electronic circuit integrated in the semiconductor body 100 of the semiconductor device 500.

As illustrated in FIG. 1B, the emitter regions 110 may be stripes extending in a lateral direction perpendicular to the cross-sectional plane of FIG. 1A. According to other embodiments, the lateral cross-sectional areas of the emitter regions 110 may be circles, ovals, ellipses or polygons, for example hexagons or squares, with or without rounded corners. According to further embodiments, the cross-sectional areas of the mesas 121 are circles, ovals, ellipses or polygons such as hexagons or rectangles with or without rounded corners. Base contact structures 332 as well as the base electrode 335 may be formed in an edge area 690 surrounding a cell area 610 including the BJT cells TC with the emitter regions 110.

Where conventional BJTs typically provide a collector region, a base region and an emitter region as a layer stack in mesas with the emitter region on top of the stack, the embodiments bury the emitter regions 110 between portions of the collector region 120 that are formed in mesas 121.

Where conventional approaches use time-consuming and elaborate processes for filling the topology before providing a metallization plane at the side with the emitter regions, for example a high-fill process, with the first surface 101 the present 3D-BJT cells TC provide a semiconductor surface which is in substance planar such that the dielectric passivation layer 210 and the metallization plane can be formed without elaborate high-fill processes.

In addition, compared to a conventional device with transistor cells having the same lateral footprint, the concept of the 3D BJT cells TC of the semiconductor device 500 increases the interface area (junction area) between the base and emitter regions 115, 110. Since the gain of a BJT cell increases with increasing junction area between the base and emitter regions 115, 110, a higher gain can be achieved in the same semiconductor area. For an emitter region 110 having a vertical dimension in the range of its lateral dimension, the gain may be three times the gain of a conventional device with the same lateral footprint.

FIG. 1B further shows a large-area emitter electrode 315 mainly formed in the cell area 610 in the vertical projection of the BJT cells TC. The base electrode 335 may be electrically connected to the base contacts 331, which provide base fingers running below the dielectric passivation structure 210, outside an active area including the BJT cells TC.

Figure 2A:
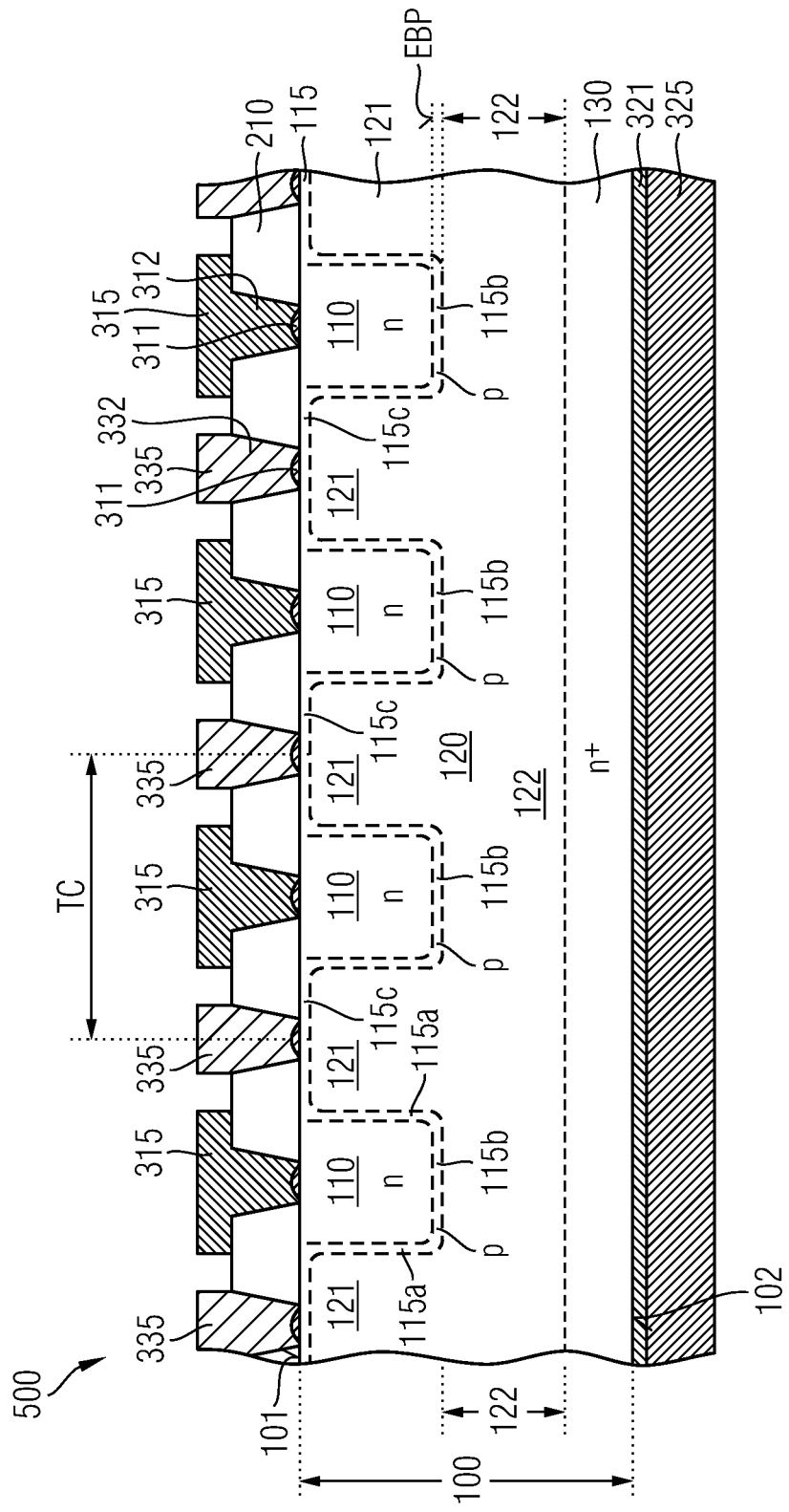
FIG. 2A is a schematic cross-sectional view of a portion of a semiconductor device including BJT cells in accordance with an embodiment providing portions of the base regions in the vertical projection of the mesas.
Figure 2B:
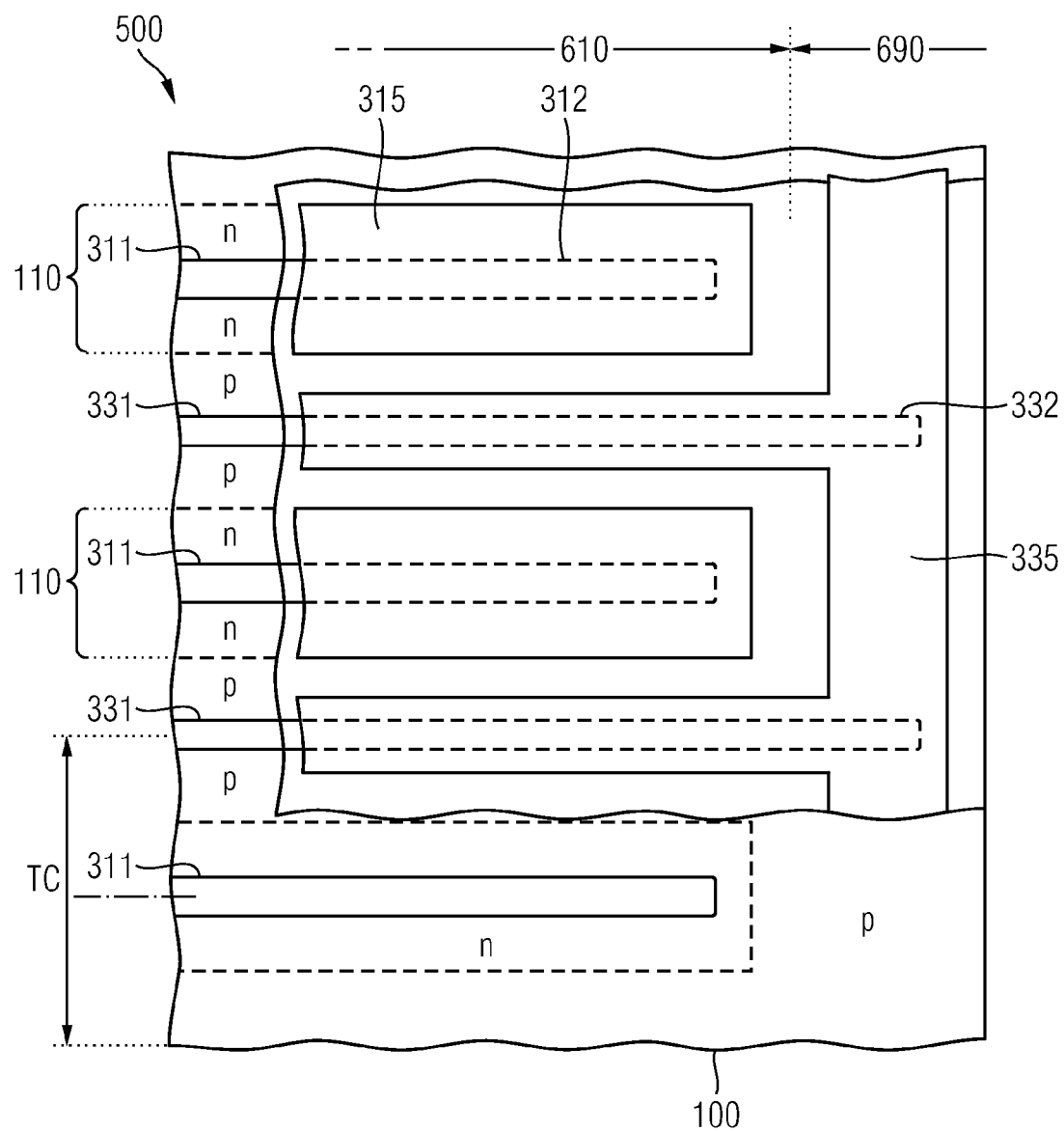
FIG. 2B is a schematic plan view of the portion of the semiconductor device of FIG. 2A.

FIGS. 2A and 2B refer to an embodiment with interdigited, comb-like base and emitter electrodes. The semiconductor device 500 includes BJT cells TC with the base regions 115 including third base portions 115c electrically and structurally connected with the first base portions 115a and arranged in the vertical projection of the mesas 121. The third base portions 115c may extend over the complete cross-sectional area of the mesas 121. According to other embodiments the third base portions 115c extend only over portions of the respective mesas 121 such that the base regions 115 of neighboring BJT cells TC are spatially separated from each other.

The base contacts 331 may directly adjoin the third base portions 115c. The base electrode 335 may include a plurality of stripes with base contact structures 332 extending through openings in the dielectric passivation structure 210 and electrically connecting the stripes of the base electrode 335 with the base contacts 331. The stripe-shaped portions of the emitter and base electrodes 315, 335 interdigitate and may form a regular line pattern.

FIG. 2B is a plan view showing the interdigitated portions of the base and emitter electrodes 335, 315. In an edge area 690 outside a cell area 610 including the BJT cells TC a connecting portion of the base electrode 335 extends orthogonal to the stripe-shaped portions that run through the cell area 610. On an opposite side of the cell area 610 a corresponding connection portion of the emitter electrode 315 may electrically connect the stripe shaped portions of the emitter electrode 315.

As regards further details, reference is made to the detailed description of the semiconductor device 500 of FIGS. 1A to 1B.

Figure 3:
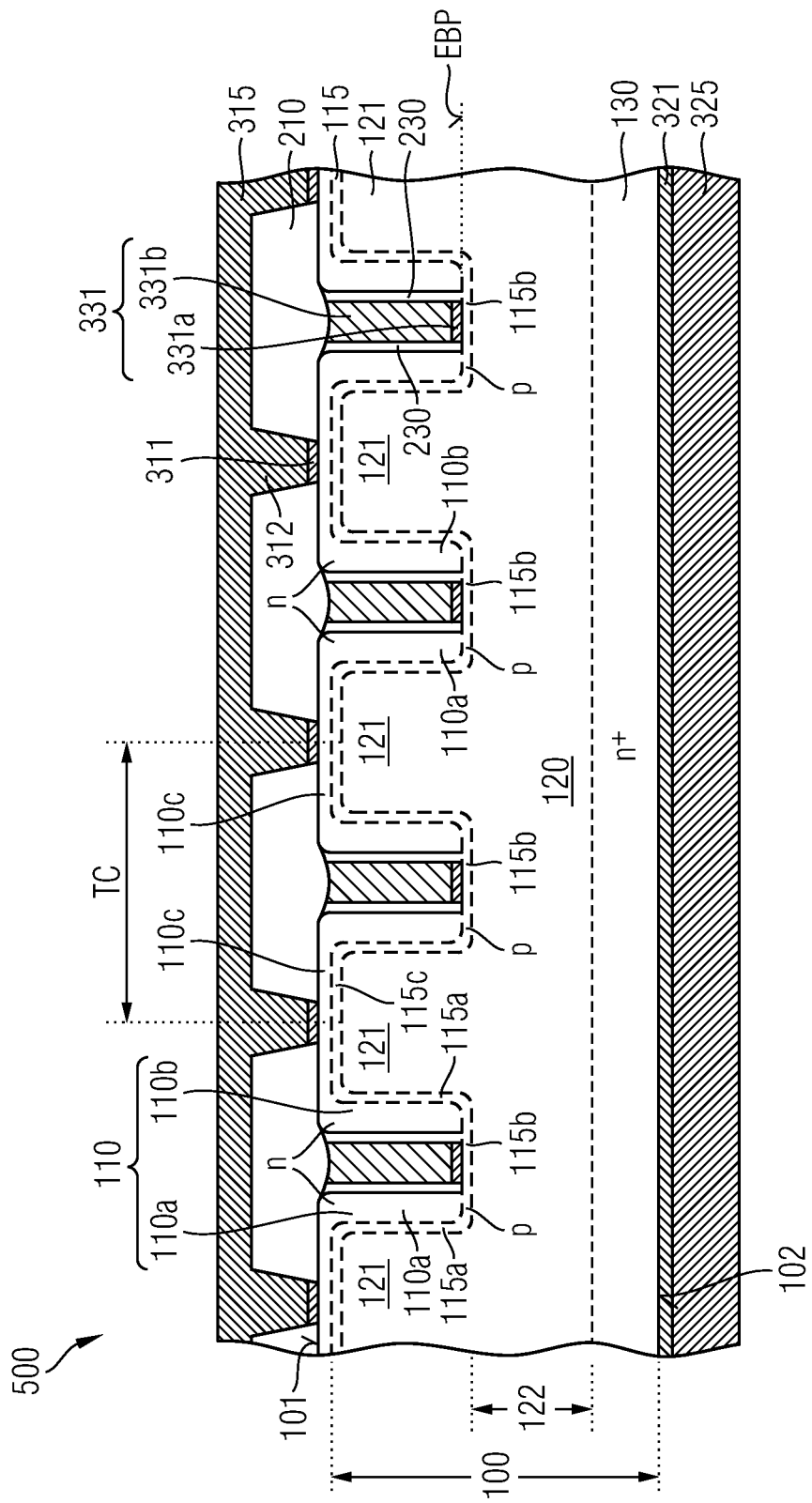
FIG. 3 is a schematic cross-sectional view of a portion of a semiconductor device including BJT cells in accordance with an embodiment providing base contact structures between the mesas.

FIG. 3 refers to an embodiment related to self-aligned base contacts 331. The emitter region 110 of each BJT cell TC includes a first and a second sub-region 110a, 110b, which are formed on opposing sides of the respective base contact 331 that directly adjoins a second base portion 115b between neighboring mesas 121.

For example, the base contact 331 may include a contact material 331a and a base contact structure may extend through a dielectric passivation structure 210 and may electrically connect the contact material 331a with a stripe-shaped portion of the base electrode 335. Similar to FIG. 2B, in an arrangement including a plurality of BJT cells TC, the stripe-shaped portions of the base electrode 335 and stripe-shaped portions of an emitter electrode 315 may interdigitate.

According to the illustrated embodiment the base contacts 331 include a highly-conductive structure 331b extending between the dielectric passivation structure 210 and the contact material 331a. The emitter electrode 315 may be formed as a compact plate arranged in the vertical projection of the BJT cells TC. Similar to FIG. 1B, base contact structures 332 may electrically connect the base contacts 331 with a base electrode 335 outside a cell area 610 including the BJT cells TC.

A contact insulator structure 230, which may consist of or include a semiconductor oxide, for example silicon oxide, a semiconductor nitride, for example silicon nitride or a semiconductor oxynitride, for example silicon oxynitride, dielectrically insulates the first and second emitter sub-regions 110a, 110b from the base contacts 331.

The emitter region 110 may be an in-situ doped semiconductor layer grown by epitaxy on the base regions 115, wherein the epitaxy process is stopped before the portions of the grown semiconductor layer growing on the first base portions 115a but against each other. The grown semiconductor layer may be anisotropically etched to remove horizontal portions on the second base portions 115b. The anisotropic etch may thin or may completely remove horizontal portions of the grown semiconductor layer from the third base portions 115c. Accordingly, the emitter region 110 may or may not include a further sub-region 110c in the vertical projection of the mesas 121.

As regards further details, reference is made to the detailed description of the semiconductor device 500 of FIGS. 1A to 1B.

Figure 4:
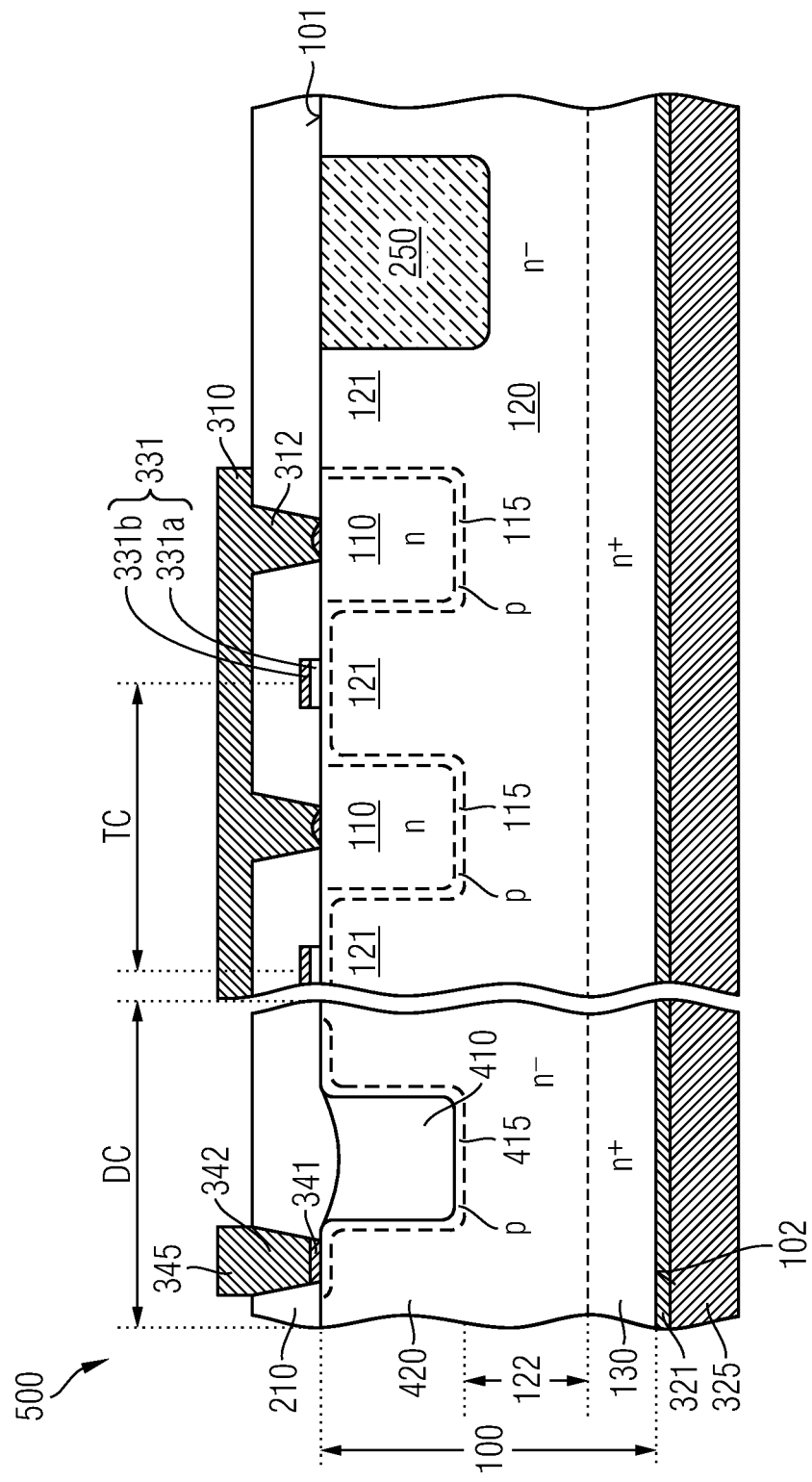
FIG. 4 is a schematic cross-sectional view of a portion of a semiconductor device including BJT cells and diode cells.

The semiconductor device 500 of FIG. 4 refers to the integration of BJT cells TC and at least one further electronic element in the same semiconductor body 100. In the illustrated embodiment the further electronic element is a diode cell DC. Other embodiments may integrate resistors, capacitors, sensors, or electronic circuits, for example driver or sensor circuits. The electronic elements may be formed oriented along trenches formed during the formation of the BJT cells TC.

For example, the diode cell DC may include a first electrode region, for example a p-type anode region 415 lining a trench extending from the first surface 101 into the semiconductor body 100. The anode region 415 may be formed from the same layer the base regions 115 of the BJT cells TC are formed from.

A second electrode region may be formed within the trench from the same layer the emitter regions 110 of the BJT cells TC are formed from. According to the illustrated embodiment a portion of the semiconductor body 100 adjoining the anode region 415 provides an n-type cathode region 420, wherein a fluid, an intrinsic semiconductor material, a conductive material, or a dielectric material may fill the trench. The cathode region 420 and the collector region 120 may form a contiguous structure. According to another embodiment a separation structure may separate the cathode and collector regions 420, 120. An electrode contact 341 including or consisting of a contact material may directly adjoin the anode region 415, wherein the electrode contact 341 may have the same configuration as the base contacts 331 of the BJT cells TC. A diode contact structure 342, which may have the same configuration as the emitter contact structures 312, may electrically connect the electrode contact 341 with a diode wiring 345, which may be arranged in the plane of the emitter electrode 315, by way of example.

The active diode area is increased without increasing the lateral footprint of the diode. The formation of the diode cell DC mainly uses processes for the formation of the BJT cells TC.

Alternatively or in addition to further electronic elements, sub-surface insulator structures 250 may extend from the first surface 101 into the semiconductor body 100. The insulator structures 250 may emerge from filling insulator trenches formed contemporaneously with the trenches for the emitter regions 110 with one or more insulator materials, such as a semiconductor oxide, for example silicon oxide, a semiconductor nitride, for example silicon nitride or a semiconductor oxynitride, for example silicon oxynitride.

The insulator structures 250 may separate two electronic elements of the semiconductor device 500 or neighboring element areas. According to other embodiments one or more of the insulator structures 250 may provide an edge termination structure surrounding an active area that includes the electronic elements and all BJT cells TC of the semiconductor device 500. The insulator structures 250 may include layers lining the trenches or filling the trenches.

The formation of the insulator structures 250 uses a trench etch used for the formation of the emitter regions 150. Width and depth of the insulator structures 250 may be the same as that of the emitter regions 150. Insulator structures 250 with a greater vertical extension than the emitter regions 150 and based on the same trench etch may be provided by increasing the width of the concerned trenches for formation of the insulator structures 250 with respect to the width of trenches for formation of the emitter regions 150.

Figure 5A:
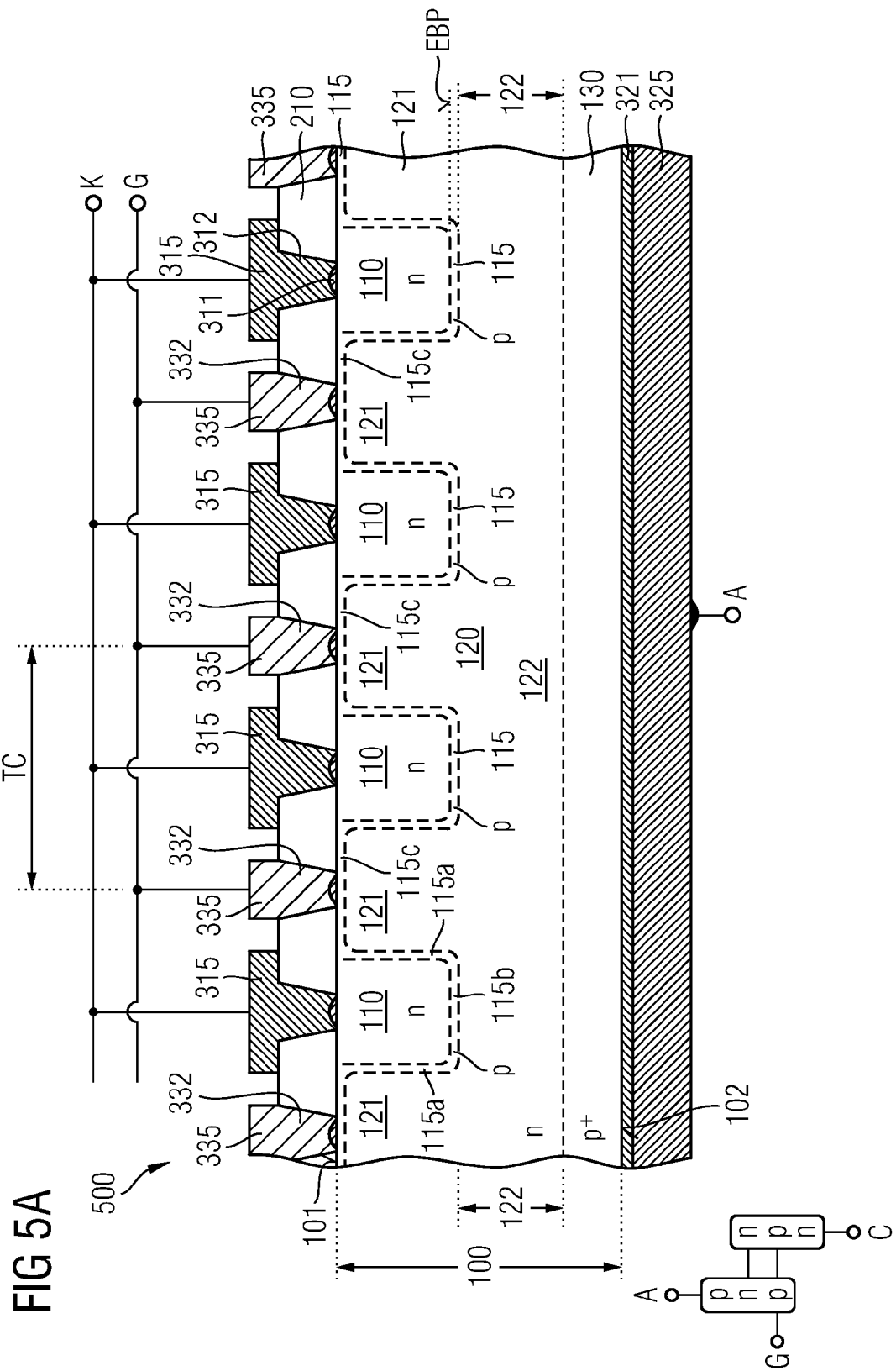
FIG. 5A is a schematic cross-sectional view of a portion of a semiconductor device in accordance with an embodiment related to a thyristor.

FIGS. 5A and 5B refer to semiconductor devices 500 including a thyristor functionality, for example a thyristor or a device integrating a thyristor and other electronic elements. Other than in the previous embodiments, the pedestal layer 130 has a conductivity type opposite to the conductivity type of the collector region 120 such that the pedestal layer 130, the collector region 120, the base regions 115 and the emitter regions 110 form a pnpn structure or an npnp structure.

FIG. 5A refers to an embodiment with the first conductivity type being the n-type. An anode terminal A of the semiconductor device 500 is electrically connected with the pedestal layer 130 which is effective as anode layer, a cathode terminal K is electrically connected with the emitter regions 110 and a gate terminal G is electrically connected or coupled to the base regions 115. A potential applied at the gate terminal G controls at which anode-to-cathode Voltage UAK the avalanche breakdown at the pn junction between the base regions 115 and the collector region 120 occurs.

The embodiment of FIG. 5B refers to an AGT (amplifying-gate thyristor) based on first and second BJT cells TC1, TC2 with separated base regions 115. The first conductivity type is the p-type. A cathode terminal K is electrically connected with the pedestal layer 130 which is effective as cathode layer. A gate terminal G is electrically connected or coupled to the base regions 115 of first BJT cells TC1. A connection structure 490 that may include or consist of a metal or metal-containing layer provides an ohmic connection between the emitter regions 110 of the first BJT cells TC1 and base regions 115 of second BJT cells TC2. An anode terminal A of the semiconductor device 500 is electrically connected with the emitter regions 110 of the second BJT cells TC2, which are effective as anode regions.

When the semiconductor device 500 switches on, the first BJT cells TC1 ignite first and ignition of the second BJT cells TC2 is enhanced by the resulting load current flow through the ignited first BJT cells TC1 that provides the base current for the second BJT cells TC2.

FIGS. 6A to 6C refer to a method of manufacturing a semiconductor device with 3D BJT cells.

An epitaxial layer 120a from a single-crystalline semiconductor material is grown by epitaxy on a single-crystalline pedestal layer 130a, wherein the crystal lattice of the epitaxial layer 120a grows in registry with the crystal lattice of the pedestal layer 130a. The single-crystalline semiconductor material of the epitaxial layer 120a may be silicon Si, germanium Ge, silicon germanium SiGe, or gallium arsenide GaAs, by way of example. According to an embodiment, the single-crystalline semiconductor material has a band gap of 2.0 eV or higher such as gallium nitride GaN or silicon carbide SiC. For example, the single-crystalline semiconductor material is silicon carbide SiC, for example 6H—SiC, 15R—SiC, 4H—SiC or 2H—SiC. The semiconductor material of the pedestal layer 130a may be the same or another semiconductor material. The pedestal layer 130a and the epitaxial layer 120a form a semiconductor body 100a of a semiconductor substrate 500a.

Trenches 190 are etched into the semiconductor body 100a from an exposed process surface 101a of the epitaxial layer 120a opposite to the pedestal layer 130a, for example, using a reactive ion etch process. The pedestal layer 130a as well as the epitaxial layer 120a, which may be in-situ doped during the epitaxial growth, have the first conductivity type, for example the n-type.

A first semiconductor layer 115x may be grown by epitaxy on the epitaxial layer 120a. The crystal lattice of the first semiconductor layer 115x grows in registry with the crystal lattice of the epitaxial layer 120a. The first semiconductor layer 115x may be in-situ doped during the epitaxial growth and may contain impurities of the second conductivity type, for example the p-type.

FIG. 6A shows the semiconductor substrate 500a including the first semiconductor layer 115x covering sidewalls of mesas 121 formed from protruding portions of the semiconductor body 100a between the trenches 190. The sidewalls of the mesas 121 may be straight, bowed or undulated. The sidewalls may be oriented approximately perpendicular to the process surface 101a. According to other embodiments, the opposing sidewalls of the trenches 190 taper with increasing distance to the process surface 101a at least in sections.

A second semiconductor layer 110x is grown by epitaxy on the first semiconductor layer 115x, wherein the crystal lattice of the second semiconductor layer 110x grows in registry with the crystal lattice of the first semiconductor layer 115x. The second semiconductor layer 110x may be in-situ doped with impurities of the first conductivity type, for example the n-type.

FIG. 6B shows the second semiconductor layer 110x filling the trenches 190 completely. The first semiconductor layer 115x includes first base portions 115a extending along the mesa sidewalls 121, second base portions 115b extending between the mesas 121 along the bottom of the trenches 190 and third base portions 115c in the vertical projection of the mesas 121.

According to the illustrated embodiment, the second semiconductor layer 110x is grown on a contiguous first semiconductor layer 115x. According to other embodiments, the first semiconductor layer 115x may be patterned before growing the second semiconductor layer 110x. For example, the third portions 115c may be cut through to form a plurality of spatially separated base regions 115. Other embodiments remove the third portions 115c completely from the vertical projection of the mesas 121.

A portion of the second semiconductor layer 110x outside the trenches 190 may be removed in a recess process.

FIG. 6C shows remnants of the recessed second semiconductor layer 110x of FIG. 6B in the trenches 190 providing emitter regions 110. Base, collector and emitter contacts may be provided from suitable contact materials as discussed above.

Shallow implants at high implant doses of the same conductivity type as the contacted semiconductor regions may be performed to reduce the transition resistances between the semiconductor regions and the contact materials. Further implants may be performed to shape the impurity profile along the bottom and the sidewalls of the trenches 190. Impurities may be locally implanted into the first semiconductor layer 110x before deposition of the second semiconductor layer 115x to improve the electric characteristics of the BJT cells. The impurity-profile of the first and/or second semiconductor layers 110x, 115x may be modified during the epitaxial growth.

The base contacts may include a highly conductive structure for increasing conductivity. A dielectric passivation structure may be deposited on the process surface 101a. A metal layer may be provided on the dielectric passivation structure and patterned to provide contact and electrode structures.

Figure 7A:
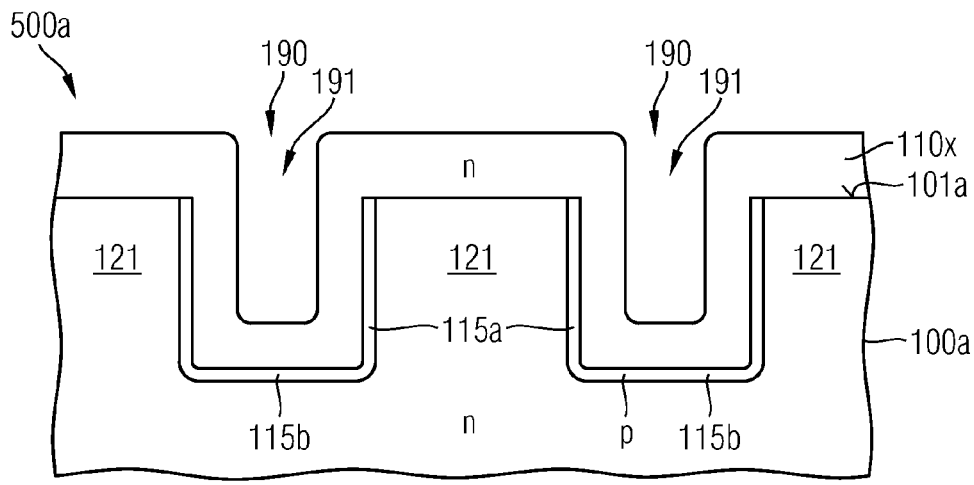
FIG. 7A is a schematic cross-sectional view of a portion of a semiconductor substrate for illustrating an embodiment of a method of manufacturing a semiconductor device with BJT cells after growing a conformal second semiconductor layer.
Figure 7B:
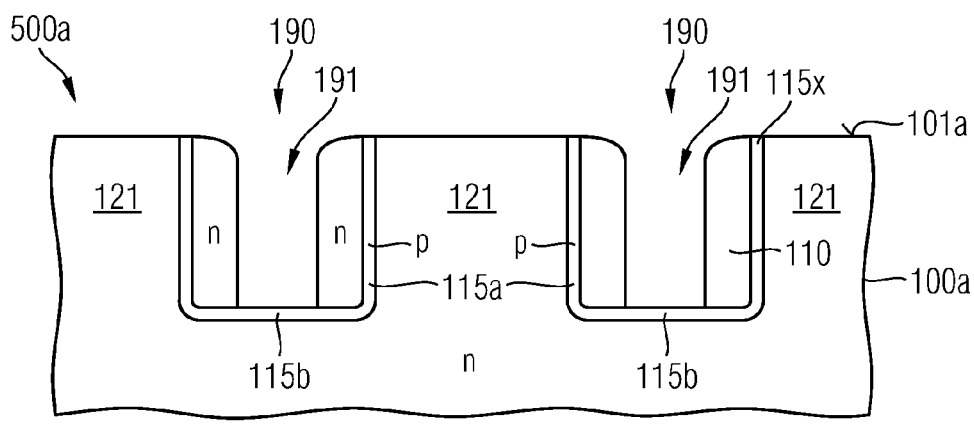
FIG. 7B is a schematic cross-sectional view of the semiconductor substrate portion of FIG. 7A after anisotropically etching the conformal second semiconductor layer.
Figure 7C:
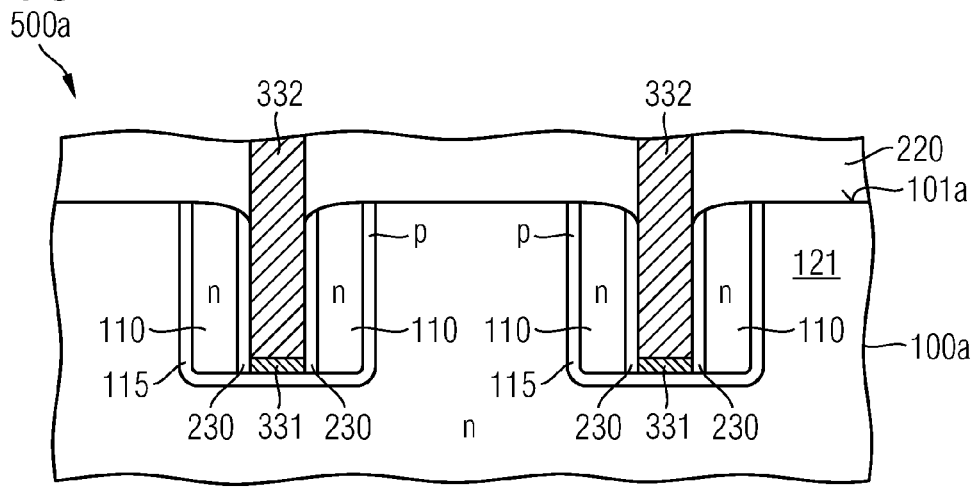
FIG. 7C is a schematic cross-sectional view of the semiconductor substrate portion of FIG. 7B after providing a base contact structure.

FIGS. 7A to 7C refer to a further method of manufacturing a semiconductor device with 3D BJT cells. A first semiconductor layer 115x is deposited on a semiconductor body 100a and, if applicable, patterned as described with reference to FIG. 6A. The second semiconductor layer 110x is provided as a more or less conformal layer, for example by a conformal deposition technique in case the single-crystalline semiconductor material is silicon or germanium, by way of example. According to embodiments related to silicon carbide, the second semiconductor layer may be an epitaxial layer of approximately uniform thickness.

In FIG. 7A the second semiconductor layer 110x covers the first semiconductor layer 115x in the vertical projection of the mesas 121, along the sidewalls of the mesas 121 and along the bottom of the trenches 190 between the mesas 121. The epitaxial growth stops before the trenches 190 are completely filled, i.e. the second semiconductor layer 110x growing on opposite sidewalls of the respective trench 190 leaves a void 191 in each trench 190.

An anisotropic etch may remove horizontal portions of the second semiconductor layer 110x in the vertical projection of the mesas 121 and at the trench bottom between the mesas 121 as shown in FIG. 7B. An insulator structure may be provided, for example by a conformal deposition process of an insulator layer. The deposited insulator layer covers the topology including the recessed second semiconductor layer 110, wherein the thickness of the insulator layer is less than a half of the width of the remaining voids 191 in the trenches 190. An anisotropic etch may remove horizontal portions of the insulator layer to form spacer-like insulator structures 230 along the remnants of the second semiconductor layer. A base contact 331 is provided at the bottom of the remaining void. The base contact 331 may include a highly conductive structure. Other embodiments may provide base contact structures 332 in the voids between the remnants of the second semiconductor layer 110x as shown in FIG. 7C.

Figure 8A:
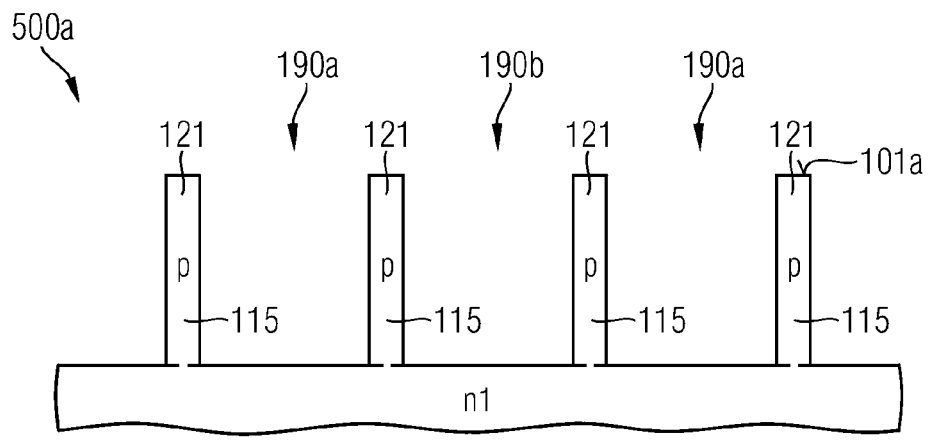
FIG. 8A is a schematic cross-sectional view of a portion of a semiconductor substrate for illustrating another embodiment of a method of manufacturing a semiconductor device with BJT cells after forming trenches.
Figure 8B:
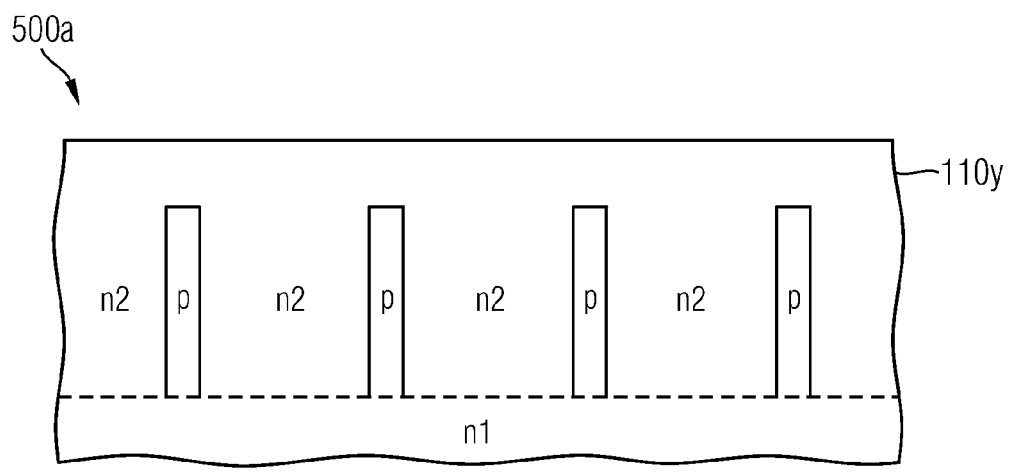
FIG. 8B is a schematic cross-sectional view of the semiconductor substrate portion of FIG. 8A after filling the trenches.
Figure 8C:
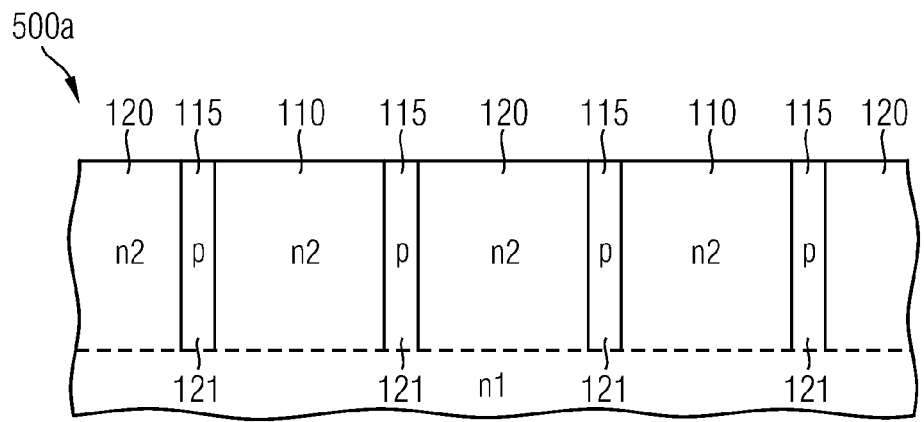
FIG. 8C is a schematic cross-sectional view of the semiconductor substrate portion of FIG. 8B after separating emitter and collector regions.

FIGS. 8A to 8C refer to a process providing both the emitter and collector regions in one deposition/epitaxy process patterned by mesas 121 defined by a trench etch.

First and second trenches 190a, 190b are etched from a first surface 101a into a semiconductor substrate 500a as described with reference to FIG. 6A.

FIG. 8A shows the first and second trenches 190a, 190b separated by mesas 121 in which the base regions 115 are formed. The width of the mesas 121 is selected such that the base regions 115, which are formed in the mesas 121, are sufficiently narrow. The widths of the first and second trenches 190a, 190b may be equal or may differ from each other. A doped semiconductor layer 110y is deposited or grown by epitaxy as described in detail with reference to FIG. 6B.

According to FIG. 8B the semiconductor layer 110y fills the first and second trenches 190a, 190b. A first portion of the semiconductor layer 110y connecting second portions in the first and second trenches 190a, 190b is removed, for example by grinding or chemical/mechanical polishing.

FIG. 8C shows the separated second portions of the semiconductor layer 110y of FIG. 8B forming emitter regions 110 in the first trenches 190a of FIG. 8A and collector regions 120 in the second trenches 190b of FIG. 8A separated by the base regions 115 in the mesas 121. Since both emitter and collector regions 110, 120 result from the same epitaxy or deposition process, the process results in identical impurity concentrations in the emitter and collector regions 110, 120.

A bipolar junction transistor according to an embodiment includes a plurality of bipolar junction transistor cells, wherein each bipolar junction transistor cell includes an emitter region which is at least partly formed between mesas of a semiconductor body and which extends between a first surface of the semiconductor body and an emitter bottom plane. A base region separates the emitter region from the collector region, wherein the collector region or the base region is formed in the mesa. Other than for approaches relying on annealing and diffusion techniques for forming emitter and collector regions as impurity wells, at least in the emitter region of the bipolar junction transistor according to the embodiment a vertical impurity concentration profile may be constant.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising a bipolar junction transistor cell that comprises:
    a semiconductor body comprising mesas protruding from a layer section, wherein top surfaces of the mesas are coplanar with a first surface of the semiconductor body;
    an emitter region partly formed between two neighboring ones of the mesas, and extending between a plane spanned by the coplanar top surfaces of the mesas and an emitter bottom plane in the semiconductor body, wherein the emitter bottom plane is between the plane spanned by the coplanar top surfaces of the mesas and the layer section;
    a collector region at least partly formed in the mesas of the semiconductor body and extending from the first surface to a pedestal layer in the semiconductor body; and
    a base region separating the emitter region and the collector region and comprising first base portions extending along sidewalls of the mesas, wherein the sidewalls are tilted to the top surfaces.
2. The semiconductor device of claim 1, wherein
    a distance between the first surface and the pedestal layer is greater than a distance between the first surface and the emitter bottom plane.
3. The semiconductor device of claim 1, wherein
    the base region further comprises a second base portion between the mesas and connecting the first base portions.
4. The semiconductor device of claim 3, wherein
    the base region further comprises third base portions in the vertical projection of the mesas, each third base portion connected to one of the first base portions.
5. The semiconductor device of claim 4, wherein
    the third base portions extend over the complete vertical projection of the mesas.
6. The semiconductor device of claim 5, wherein
    the emitter region comprises a first and a second subregion formed on opposing sides of a base contact structure extending between the mesas from the first surface to the second portion of the base region.
7. The semiconductor device of claim 6, wherein
    the emitter region comprises third sub-regions in the vertical projection of the mesas.
8. The semiconductor device of claim 6, wherein
    the emitter region is completely formed between the mesas.
9. The semiconductor device of claim 1, further comprising:
    a plurality of the bipolar junction transistor cells.
10. The semiconductor device of claim 9, wherein
    the plurality of the bipolar junction transistor cells is arranged in a regular pattern.
11. The semiconductor device of claim 1, further comprising:
    an anode region formed between second mesas of the semiconductor body and a cathode region formed at least partly in the mesas, the anode and cathode regions arranged to form a diode.
12. The semiconductor device of claim 1, further comprising:
    an insulator structure formed between third mesas of the semiconductor body.
13. The semiconductor device of claim 1, wherein
    the semiconductor body, the base region and the emitter region comprise silicon carbide.
14. The semiconductor device of claim 1, wherein
    in the emitter region a vertical impurity concentration profile perpendicular to the first surface is constant.

* * * * *